United States Patent
Cohen

(10) Patent No.: US 9,344,304 B1
(45) Date of Patent: May 17, 2016

(54) COMMUNICATION DEVICE WITH POWER SUPPLY LOAD VARIATION NOISE REDUCTION FOR ENVELOPE TRACKING AND METHOD THEREFOR

(71) Applicant: Intel IP Corporation, Santa Clara, CA (US)

(72) Inventor: Emanuel Cohen, Zichron Yaacov, Z (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/575,695

(22) Filed: Dec. 18, 2014

(51) Int. Cl.
| | |
|---|---|
| H03F 3/217 | (2006.01) |
| H04L 25/08 | (2006.01) |
| H04L 27/26 | (2006.01) |
| H03F 1/02 | (2006.01) |
| H03F 3/19 | (2006.01) |
| H03F 3/21 | (2006.01) |

(52) U.S. Cl.
CPC .............. *H04L 25/08* (2013.01); *H03F 1/0211* (2013.01); *H03F 3/19* (2013.01); *H03F 3/21* (2013.01); *H03F 3/217* (2013.01); *H04L 27/2626* (2013.01); *H03F 2200/102* (2013.01); *H03F 2200/451* (2013.01)

(58) Field of Classification Search
CPC ........... H03F 3/189; H03F 3/20; H03F 3/211; H03F 3/602; H03F 2201/32; H03F 2200/387; H03F 2200/471; H03F 3/005; H03F 3/38; H03F 1/303
See application file for complete search history.

(56) References Cited

U.S. PATENT DOCUMENTS

| | | | | |
|---|---|---|---|---|
| 8,432,219 | B1* | 4/2013 | Cook | 330/135 |
| 2009/0096525 | A1* | 4/2009 | Staszewski et al. | 330/277 |
| 2010/0264991 | A1* | 10/2010 | Young et al. | 330/296 |
| 2012/0146731 | A1* | 6/2012 | Khesbak | 330/295 |
| 2013/0094606 | A1* | 4/2013 | Lai et al. | 375/295 |
| 2014/0112414 | A1* | 4/2014 | Lu et al. | 375/297 |
| 2015/0097624 | A1* | 4/2015 | Olson et al. | 330/295 |
| 2015/0171768 | A1* | 6/2015 | Perreault | |

\* cited by examiner

*Primary Examiner* — Aristocratis Fotakis

(74) *Attorney, Agent, or Firm* — Schwegman Lundberg & Woessner, P.A.

(57) ABSTRACT

A switching apparatus comprises a number of instantiations of switching load cells operating at a first voltage and at a second voltage to switch a digital structure. The instantiations are turned on by a respective control bits. Each load cell comprises a charging capacitor coupled to a power amplifier. An output node can be coupled to a load capacitance. Switching circuitry couples the charging capacitor to the load capacitance and connects a voltage regulator to the output node to regulate voltage to the second voltage. The timing logic couples the charging capacitor to the first voltage, couples the charging capacitor to the load capacitance and disconnects the first voltage from the charging capacitor during a switching event, disconnects the charging capacitor from the load capacitance and connects the voltage regulator to the output node after the switching event. The apparatus may be embodied in envelope tracking.

30 Claims, 10 Drawing Sheets

COMMUNICATION DEVICE WITH POWER SUPPLY LOAD VARIATION NOISE REDUCTION FOR ENVELOPE TRACKING AND METHOD THEREFOR

FIELD

Embodiments described herein relate to noise reduction for load variation in envelope tracking. Some embodiments relate to power supplies for radio frequency (RF) power amplifiers in communication devices. Some embodiments relate to User Equipment (UE) in cellular networks, including $3^{RD}$ Generation Partnership Project Long Term Evolution (3GPP LTE) networks.

BACKGROUND

As electronic devices, such as computers, cellular phones and other mobile devices, progress to faster RF architecture, systems encounter an issue of increased power supply sensitivity that may limit RF performance. Since the architecture is based on switching of large digital structures, the power supply should cope with high current charges that cause a significant drop on the supply. In addition the switching speed may be at very high frequency which may not allow the voltage regulator to react and correct for the voltage error before a new switching error occurs. It is therefore desirable to provide power supply noise reduction for very fast switching with minimal noise, little or no penalty in power consumption, and little addition in size.

DETAILED DESCRIPTION

As electronic devices progress towards more and faster digital RF architecture, systems encounter an issue of increased supply sensitivity that limits RF performance. Since the architecture is based on switching of large digital structures the power supply needs to cope with high current charges that cause a significant drop on the power supply. As used herein, a single switching may be referred to as a "switching event." In currently known solutions, if the ripple on the power supply is limited to, say ten millivolts, then for a 5 pF load and a voltage of one volt, capacitances in the order of five hundred (500) picoFarads (pF) may be required to reduce voltage drop. Further, the low dropout (LDO) regulator used in embodiments would respond to a switching error and correct it before the next switching event occurs. However, the switching speed is at very high frequency which does not allow the regulator to react and correct for the voltage error before a new switching error occurs. In past solutions, the bypass capacitor has been increased significantly and the regulator response was speeded up by adding more current, which is problematical.

The disclosed subject matter resolves the issue by taking into account the fact that that the load current charge is predefined in many cases and therefore the right amount of charge needed for each switching event can be prepared, thus reducing the ripple on the power supply and the amount of bypass capacitance needed in the semiconductor die. This technique may be implemented, in one embodiment, in an RF transmitter as an envelope tracking system, with bypass capacitance reduced dramatically. In some embodiments capacitances of a few hundred picoFarads (pF) can be reduced to around 10 pF. The implementation may affect the power amplifier of a transmitter operating within $3^{RD}$ Generation Partnership Project (3GPP) specifications. The transmitter may be operating with non-constant envelope modulations like Wideband Code Division Multiple Access (WCDMA) or Orthogonal Frequency Division Multiplexing (OFDM). Envelope tracking for an RF PA for such transmitters may require switching different resistive loads that define the actual voltage that the PA sees and by which it creates an envelope tracking implementation.

Figure 1:
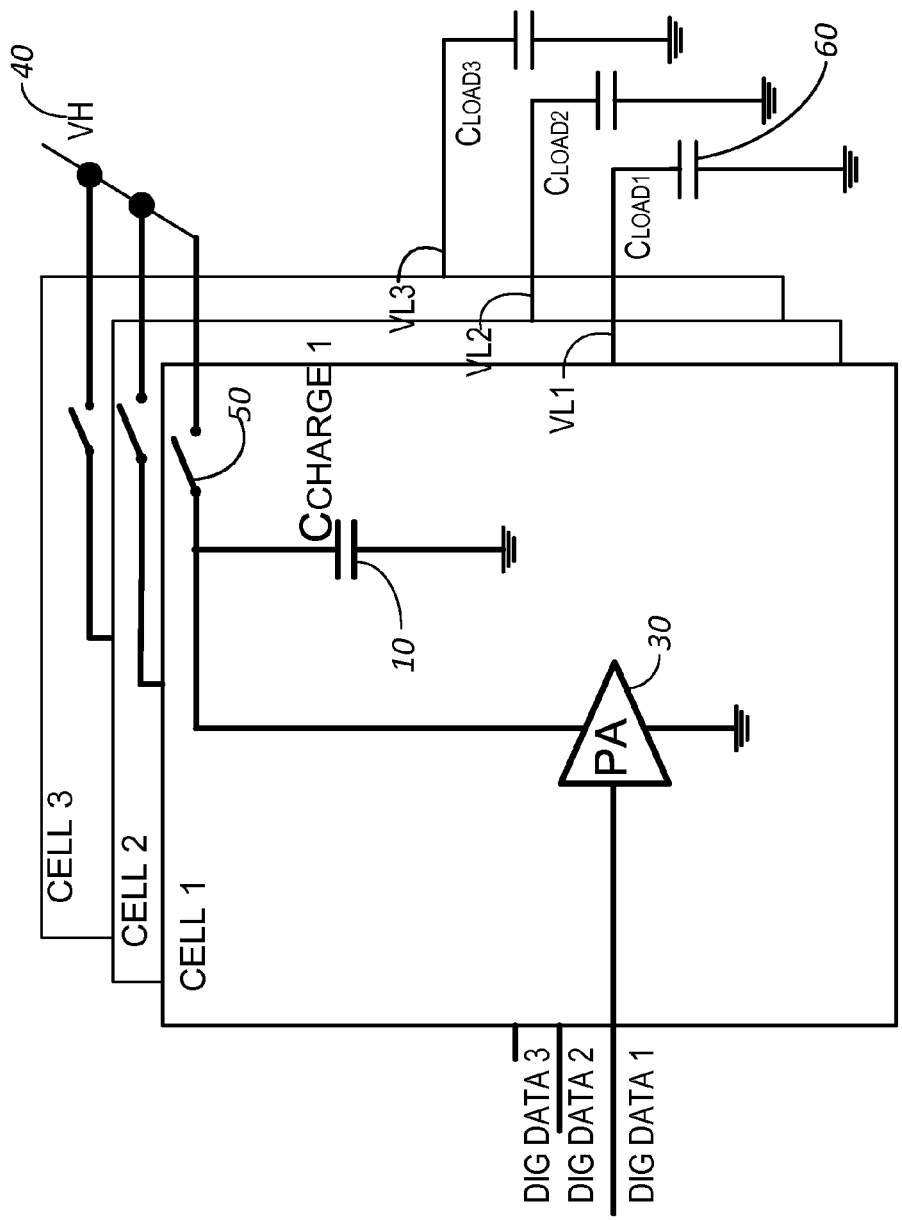
FIG. 1 is an example of power supply noise reduction load cell switching, according to some embodiments.

FIG. 1 is an example of power supply noise reduction cell switching, according to an embodiment. A digital structure comprises a plurality of cells, where each cell may be controlled with a respective bit of a digital control signal for switching. Three instantiations of cells are illustrated, the number being for example purposes only. There will be many more than three in real switching situations. Each cell has a load capacitance, for example $C_{LOAD1}$ illustrated at 60 for one instantiation, i.e., Cell 1, and an additional capacitance and switch, for example, $C_{CHCARGE1}$ illustrated at 10 and switch 50, for noise reduction. In this case the capacitor 10, $C_{cHARGE}$, is coupled to PA 30 which is connected to a higher, 40, of two voltage supplies VH via a switch represented at 50. During the switching event, capacitor 10 for the PA 30 is detached from VH and connected to a load capacitance 60 (Cload) via a switching component (not shown). By choosing the right ratio between $C_{CHARGE}$ and Cload the switching will create the wanted value of load voltage (VL). For typical systems VH may be approximately 1.8V and VL may be approximately 1V. This gives a ratio of 1.25 in accordance with equation (1).

$$\frac{C_{CHCARGE}}{C_{LOAD}} = \frac{VL}{VH-VL} = \frac{1}{1.8-1} = 1.25 \quad (1)$$

This yields the capacitor, $C_{CHARGE}$, having a value of only 6.25 pF (For a 5 pF CLOAD).

As discussed above, FIG. 1 illustrates three cell instantiations, Cell 1, Cell 2, and Cell 3, as an example. The number of instantiations depends on a number of bits of digital data used to control the digital structure, or digital block. Only three are illustrated for simplicity but there are hundreds of them typically. Each cell is designed so that it will prevent switching noise when switched, where the switching is not related to other cells that may be switching also. Stated another way, the above example may be repeated for each load cell, as shown in example form in FIG. 1, e.g.:

switching event 1: Digital Data 1, $C_{CHARGE1}$, $C_{LOAD1}$, VL1, switching event 2: Digital Data 2, $C_{CHARGE2}$, $C_{LOAD2}$, VL2, switching event 3: Digital Data 3, $C_{CHARGE3}$, $C_{LOAD3}$, VL3,

.

.

.

switching event N: Digital Data N, $C_{CCHARGE}$, $C_{LOADN}$, VLN.

The embodiment of FIG. 1 has been shown by simulation to create almost no error, with a very small capacitor. In addition each switching cell now has its own CCHARGE value that there are essentially no errors dragged from one cell to the other as in the case of using a single supply to all the switching cells. This division removes the issue of "memory" in existing solutions that required investing a significant amount of current in the low dropout (LDO) regulator used, for fast settling. In the embodiment under discussion the amount of charge needed for each switching event has been prepared in order to reduce the noise on the power supply. The injected charge may be stored on a different capacitor that is to scale with the load that is being switched to. This provides very fast switching with minimal noise, essentially no penalty in power consumption, and a small addition in size. In fact, the additional size is relatively small and yields a substantial improvement compared to existing options.

Figure 2:
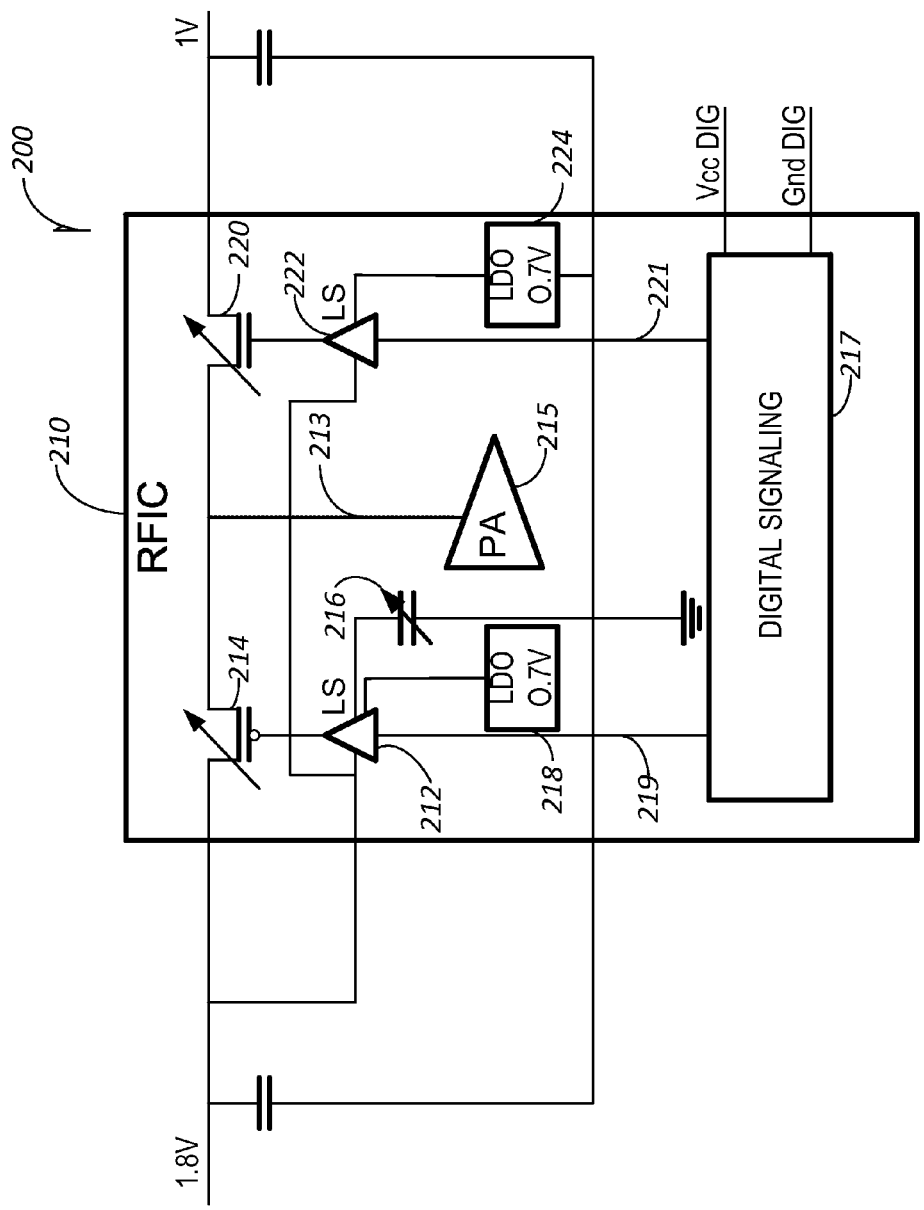
FIG. 2 illustrates an envelope tracking system with a level shifter, according to some embodiments.

FIG. 2 illustrates an envelope tracking system with a level shifter, or LS, according to an embodiment. When used in an actual circuit of envelope tracking for an RF PA, the embodiment of FIG. 1 will need to switch different resistive loads that define the actual voltage $VL_N$ seen by the PA, and by which it creates an envelope tracking embodiment. The envelope tracking embodiment 200 is implemented in radio frequency integrated circuit (RFIC) 210. Level shifter 212, discussed in greater detail below with respect to FIGS. 3A-3C, drives the PMOS switch 214 connection 213 to the PA 215. This PMOS switch control needs to work between 1.8 V to 0.7 V in one embodiment, these voltage values being only example values. The 0.7 volt needs to be precise, however, because it is the "On" voltage, and error in this voltage is translated to the PA and to the output of the communication device of which this embodiment may form a component. A usual solution would normally be to create a 0.7 volt LDO regulator for the level shifter. However, this would add significant noise to the output and the disclosed embodiment resolves this problem, providing a very clean spectrum at the PA output, discussed subsequently. The level shifter 212 of FIG. 2 uses charging capacitor 216 for the low voltage, much the same as was shown in FIG. 1 for the higher voltage VH. In addition, the circuit of FIG. 2 has an LDO regulator 218 for 0.7 volts that is connected to the level shifter 212 after the switching event. This switching to the LDO regulator 218 removes errors that are created due to mismatch between the capacitor $C_{CHARGE}$ and the PMOS capacitance that may vary with process or with output voltage. Level shifter 212 is connected via line 219 to the digital signal source 217 for envelope tracking of a digital signal. Level shifter 222 is connected via line 221 to digital signal source 217 for envelope tracking of a digital signal. PMOS switch 220, level shifter 222 and LDO regulator 224 operate similarly to PMOS switch 214, level shifter 212 and LDO regulator 218, but for the 1.0 volt supply instead of the 1.8 volt supply.

Figure 3:
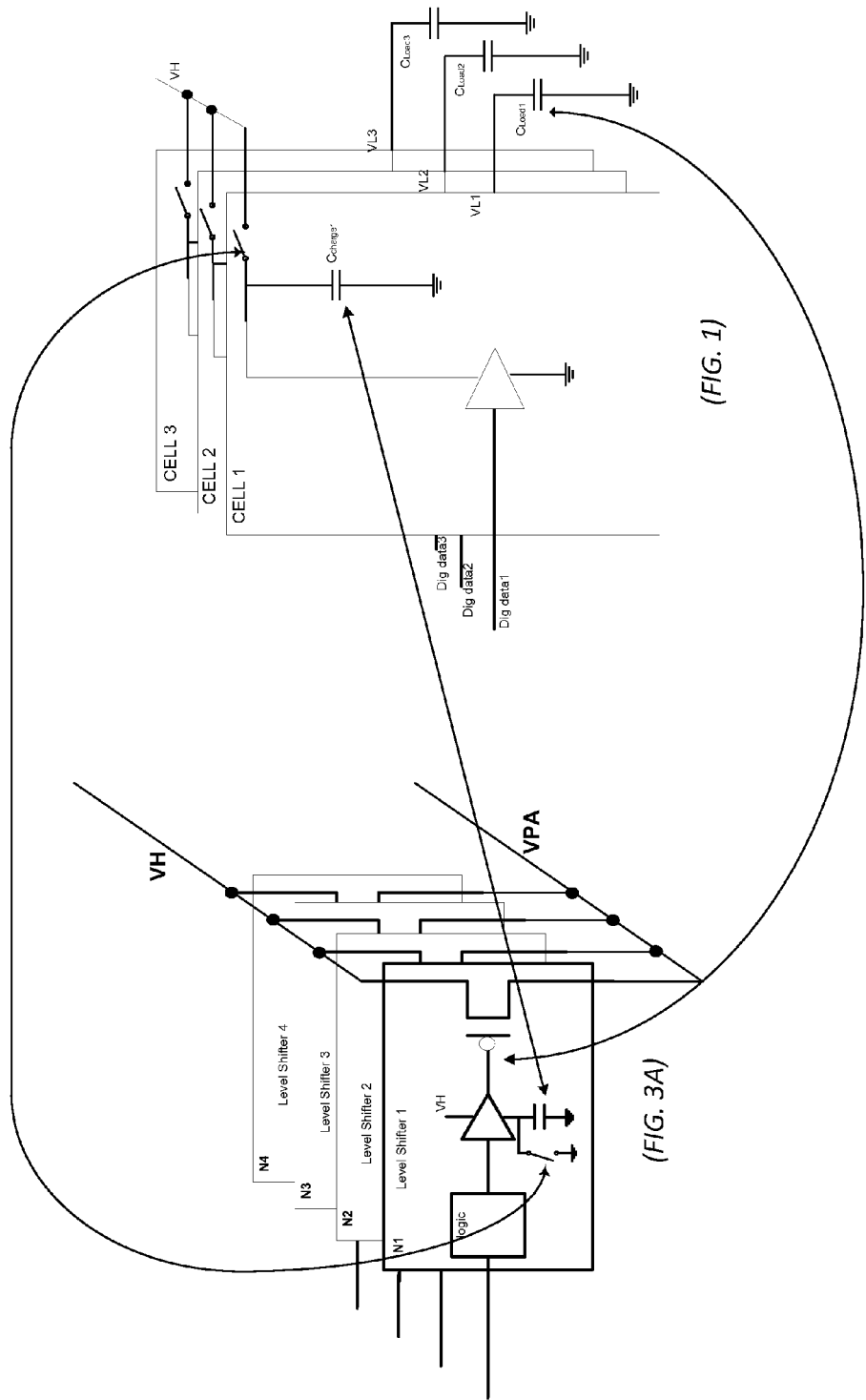
FIG. 3 is an illustration of the relationship between FIG. 3A and FIG. 1, according to some embodiments.
Figure 3A:
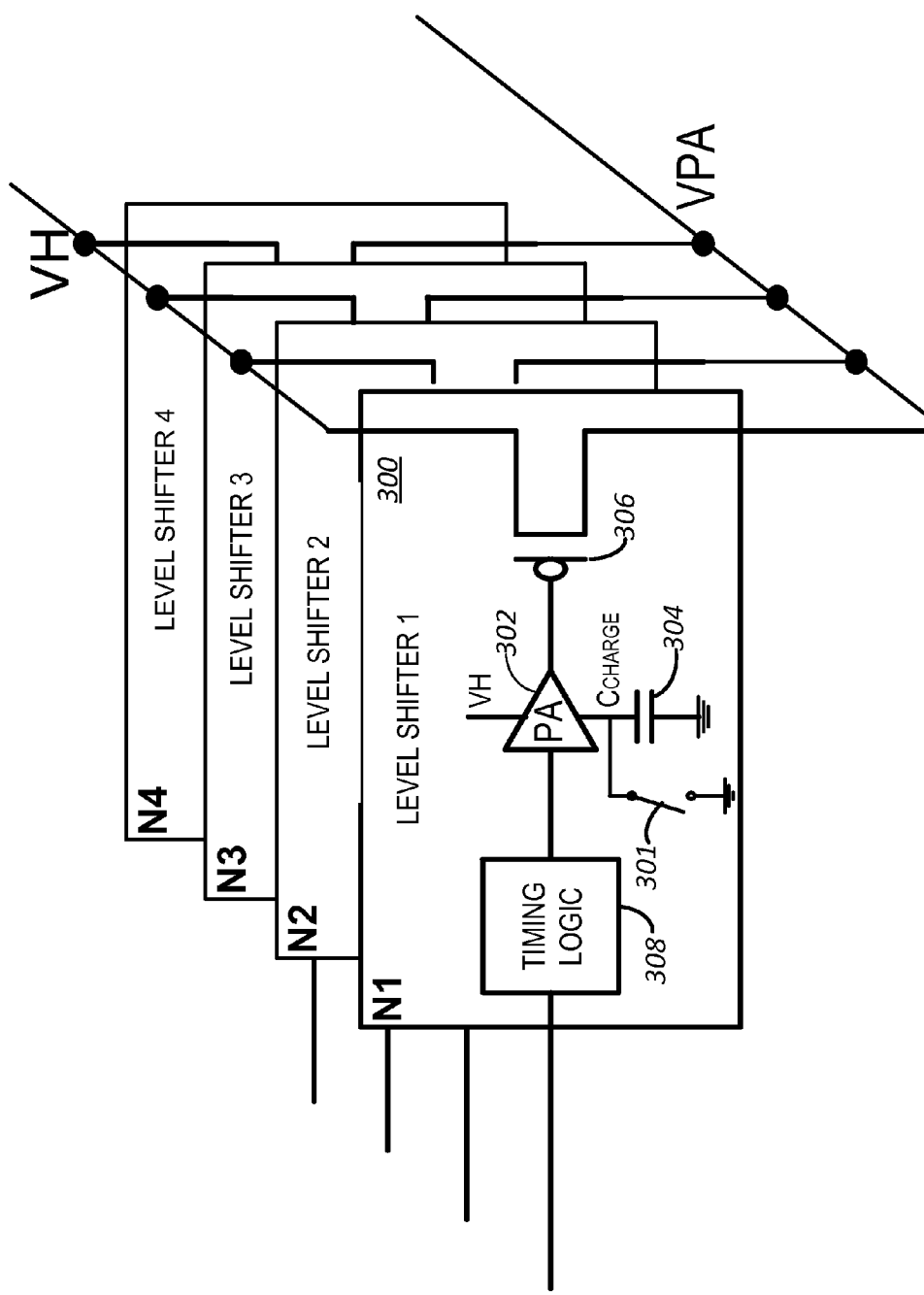
FIG. 3A is a schematic block diagram of a level shifter connection to a P-type Metal Oxide Semiconductor (PMOS) switch for a power amplifier (PA) for envelope tracking operation, according to some embodiments.

FIG. 3 illustrates the relationship between FIG. 1 and FIG. 3A, according to an embodiment. For example, the arrows indicate that capacitor 304 of level shifter 1 (the first instantiation of a level shifter) of FIG. 3A represents capacitor 10 ($C_{CHARGE1}$) of the first instantiation of FIG. 1 which, as previously explained illustrates, only as an example, three cells. Similarly, switch 301 of FIG. 3A represents switch 50 to VH in FIG. 1. In FIG. 1 there was created a voltage of 1V or 0V (not shown). The 0V in FIG. 1 is created by switching the driver to ground and the 1V is created by switching the capacitive charge load from $C_{CHARGE}$ to $C_{LOAD}$. In FIG. 3A the created voltages are 1.8V, illustrated as VH, and 0.7 volts, illustrated as VL at the gate of the PMOS 306 that is the load described in FIG. 1 as CLOAD. The 1.8V (VH) is created by switching the driver to VH. The 0.7V is created by capacitive charge between the $C_{LoAD}$ (not shown in FIG. 3A) and the CCHARGE, which, as stated above, is the capacitor illustrated at 304 of FIG. 3A. Consequently the system in FIG. 3A represents the same as that in FIG. 1 but with opposite levels compared to FIG. 1. In other words in FIG. 3A the capacitor 304 is charged to ground instead of to VH as in FIG. 1.

FIG. 3A is a schematic block diagram of a plurality of level shifter instantiations. Illustrated are four level shifters, at N1, N2, N3, and N4, analogous to the exemplary level shifters illustrated in FIG. 1. In FIG. 3A, level N1 symbolically illustrates level shifter 1, including PA 302, capacitor 304, and PMOS switch 306 with respect to power supply voltage VH. The combination may be the same as, and function similarly to, level shifter 212, PA 215, capacitor 216, and PMOS switch 214 for the higher voltage VH of FIG. 2. The level shifter instantiations are defined as a function of the number of bits used to control the digital structure. This may be explained with reference to FIG. 2. The capacitor 216 of FIG. 2 is the sum of the "on" capacitors 304 in the instantiations of FIG. 3A. In other words capacitor 216 is split in many cells with smaller capacitors 304 and the total value of capacitor 216 depends on the number of cells that are "on." Therefore, the value of capacitor 216 varies with the digital control code, the 1's and 0's of the digital control code indicating which loads are being switched. In addition, the switch to ground 301 of FIG. 3A is the same as switch 50 to VH in FIG. 1. Operation is discussed below with respect to FIGS. 4A and 4B.

Figures 3B, 3C:
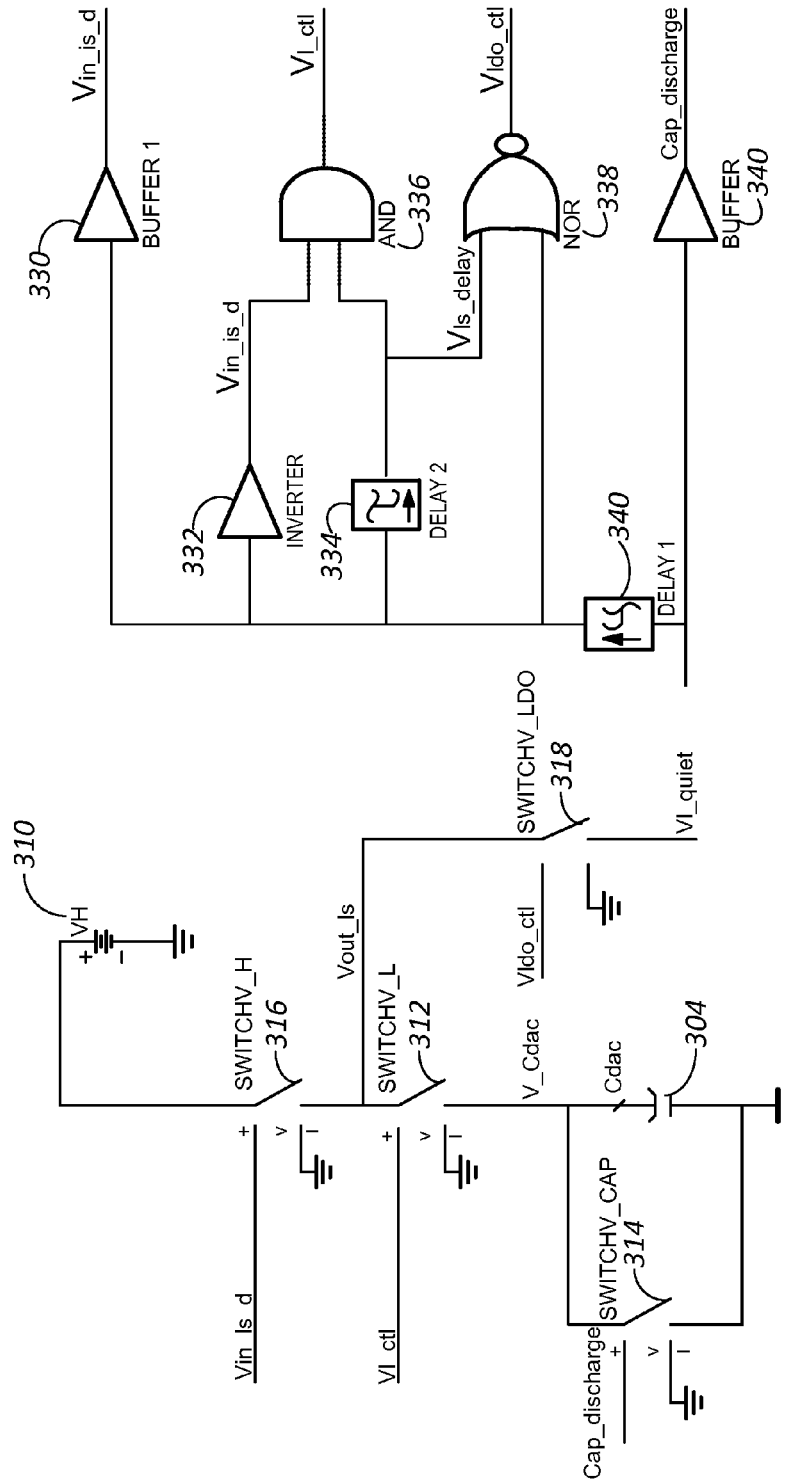
FIG. 3B illustrates a level shifter schematic implementation for the level shifter of FIG. 3A, according to some embodiments.
FIG. 3C illustrates logic for timing the level shifter of FIG. 3A, according to some embodiments.

FIG. 3B illustrates a level shifter schematic implementation for the level shifter of FIG. 3A, according to an embodiment. Power supply VH is seen at 310. Capacitor CDAC is seen at 304 of FIG. 3A and is analogous to capacitor $C_{CHARGE1}$ of FIG. 1. Capacitor 304 may be reset and released by switch 314. The level shifter may be turned on by connecting capacitor 304 to the output via switch 312, and power supply voltage VH at 310 may be connected and disconnected from the level shifter by switch 316. The output may be connected to the LDO regulator via switch 318.

FIG. 3C illustrates logic for timing the level shifter of FIG. 3A, according to an embodiment. The timing diagram in FIG. 4B, discussed in additional detail below, also describes the logic timing for the logic of FIG. 3B. When the logic input is "1" the driver to VH is connected and the Cdac is disconnected from the load and connected to ground. The LDO is also disconnected. When the input is "0" the driver from VH is disconnected and the load is connected to Cdac that is not shorted. After a short period (tens of psec) the load is connected to LDO instead of the Cdac.

Figure 4A:
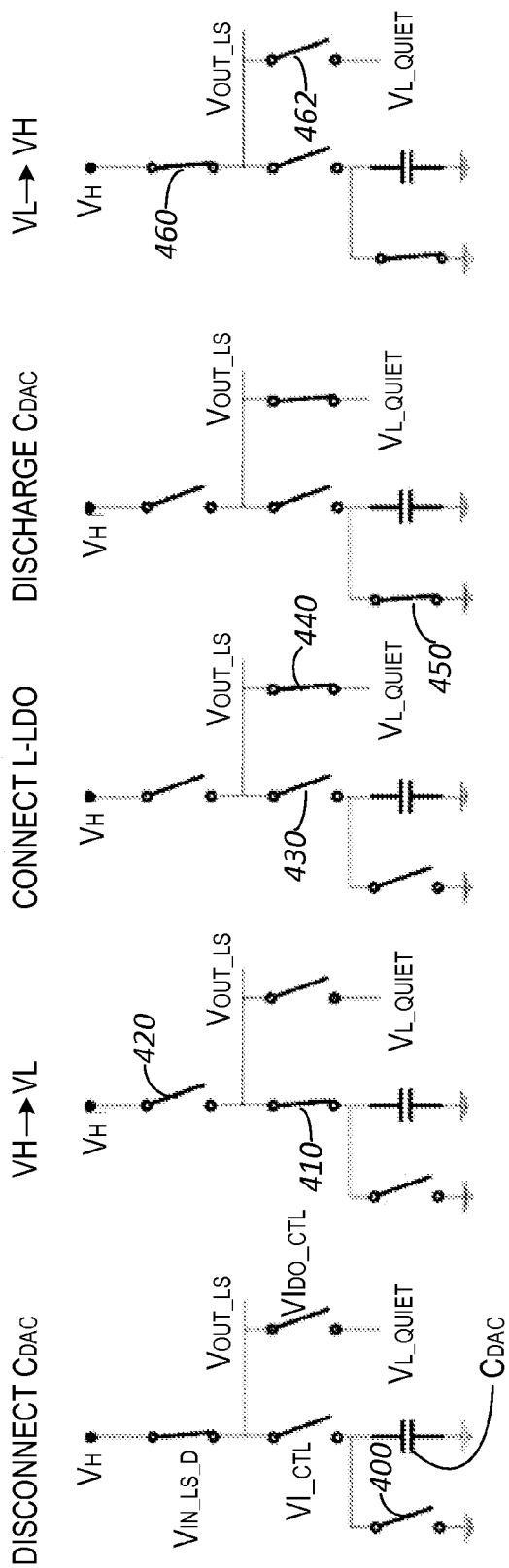
FIG. 4A is a diagram of level shifter switch states for different transitions of a level shifter, according to some embodiments.

FIG. 4A is a diagram of level switch states for different transitions of a level shifter, according to an embodiment. The voltage waveforms at each step in the level switch state diagram is explained in the discussion of FIG. 4B, below. In the timing sequence of level shifter operation of FIG. 4A, capacitor Cdac is released (cap_discharge) at 400. Next, the level shifter is turned on by connecting the Cdac to the output at 410 and disconnecting the VH at 420. The Cdac capacitor now charges and reaches the required voltage of, for this embodiment, 0.7V. This is due to the ratio between the Cdac value and the PMOS (306 of FIG. 3A), which is switched on. The values of the two latter components are almost the same size in this embodiment. The next step is to disconnect the Cdac from the output at 430 and connect the output to a steady regulator, such as an LDO regulator, at 440. As discussed earlier, this connection zeros the mismatch error that might appear in the Cdac charge. In the opposite level shifter transition the Cdac is reset at 450 and then the level shifter is connected to VH at 460.

Figure 4B:
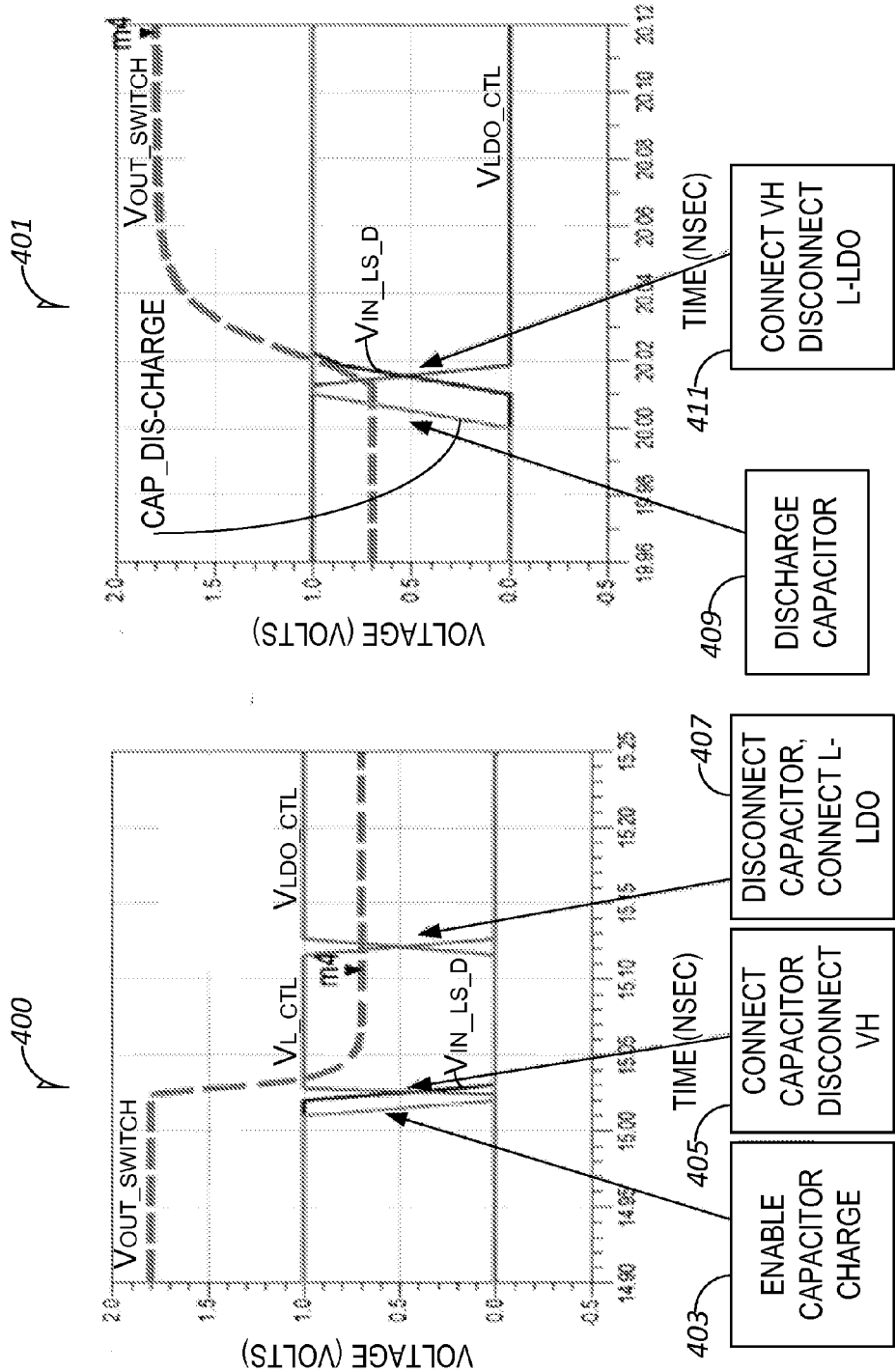
FIG. 4B is a timing diagram of level shifter control waveforms, according to some embodiments.

FIG. 4B are waveform diagrams of a level shifter control, according to an embodiment. In diagrams 400, 401 of FIG. 4B, the vertical axis is voltage, in volts, and the horizontal axis is time, in nanoseconds, so that the illustration shows voltage switching waveforms over time. The voltages are marked on diagrams 400, 401 of FIG. 4B. At diagram 400 the control voltages and their meaning are:

Vl_ctl—Controls the connection between LS out and Cdac.
Cap_discharge—Controls the discharge of the Cdac to ground.
Vin_LS_d—Controls the connection between LS out and VH.
Vout_switch—Is the LS output marked as Vout_ls in the switches schematic.
Vldo_cntl—Controls connection between LS out and quiet regulator VL_quiet.

At diagram 401 the control voltages and their meaning are:
Cap_discharge—Controls the discharge of the Cdac to ground.
Vin_ls_d—Controls the connection between LS out and VH.
Vout_switch—Is the LS output marked as Vout_ls in the switches schematic.
Vldo_ctl—Controls the connection between LS out and quiet regulator VL_quiet.

The above control voltages are graphically associated with each of the level switch states on FIG. 4A. As stated above, the waveforms associated with the steps of the level switch states are illustrated on FIG. 4B. Reading the state diagram of FIG. 4A and the waveform diagram of FIG. 4B together illustrates a sequence that is helpful in understanding operation of an embodiment. Initially, and as indicated at 403 of FIG. 4B and at 400 of FIG. 4A, the capacitor Ccap is charged. As indicated at 405 of FIG. 4B, the capacitor is connected to the output Vout_LS as seen at 410 of FIG. 4A and VH is disconnected from the output as seen at 420 of FIG. 4A. At 407 of FIG. 4B the capacitor is disconnected from the output and the LDO voltage regulator is connected to the output, as illustrated at 430 and 440, respectively, of FIG. 4A. At 409 of FIG. 4B, the capacitor is discharged and at 411, VH is connected to the output and the LDO voltage regulator is disconnected from the output. This is seen at 450, 460 and 462 of FIG. 4A. By using this switching method the supply ripple reduces from 200 mV to less than 5 mV and this change allows an achievement of a transmitted spectral noise floor that is around 70 dBc down from the main transmission. This low noise floor is highly important for good coexistence performance with cellular devices. The disclosed embodiments allow driving large capacitive loads very fast (GHz scale) with very low ripple on the power supply. This is achieved with a factor of 100 reduction in the capacitance used compared to existing solutions, and with essential no power consumption penalty. The disclosed embodiments use the fact that the load switching is predefined, allowing the right amount of charge needed for each switching event to be prepared in advance, thus reducing the ripple on the power supply and the amount of bypass capacitance needed in the semiconductor die. The essentially exact charge compensation may achieved by embedding the compensating charge with each of the digital cells that are switched. The disclosed embodiments illustrate that the solution is operative for VH control or VL control and each solution has been described. The solution is further improved by adding a "quiet LDO" that absorbs essentially any charge error that could be created due to mismatched and non-linearity's in the system, and the illustrated envelope tracking system has been implemented.

Figure 5:
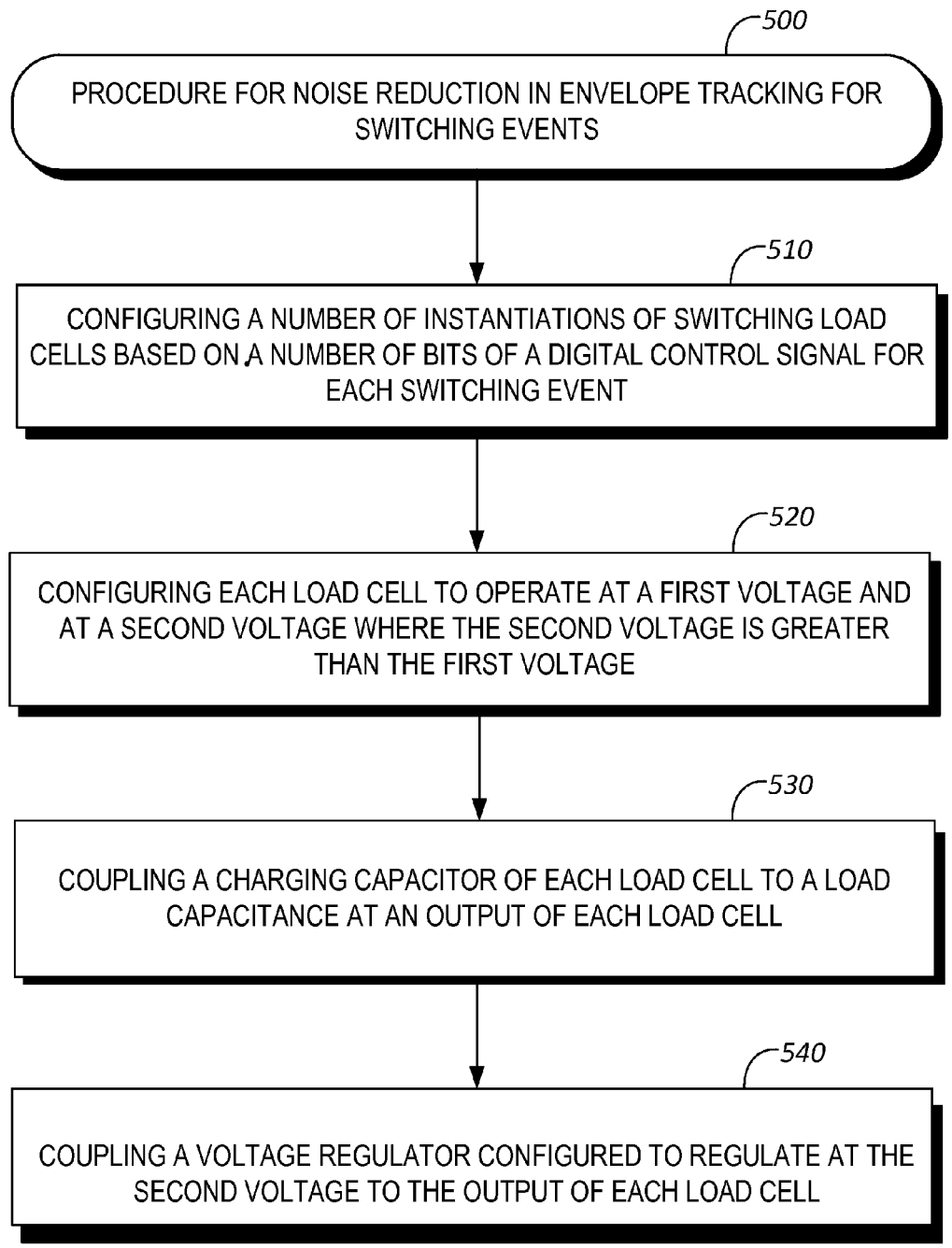
FIG. 5 is a flowchart of a method, according to some embodiments.
Figure 6:
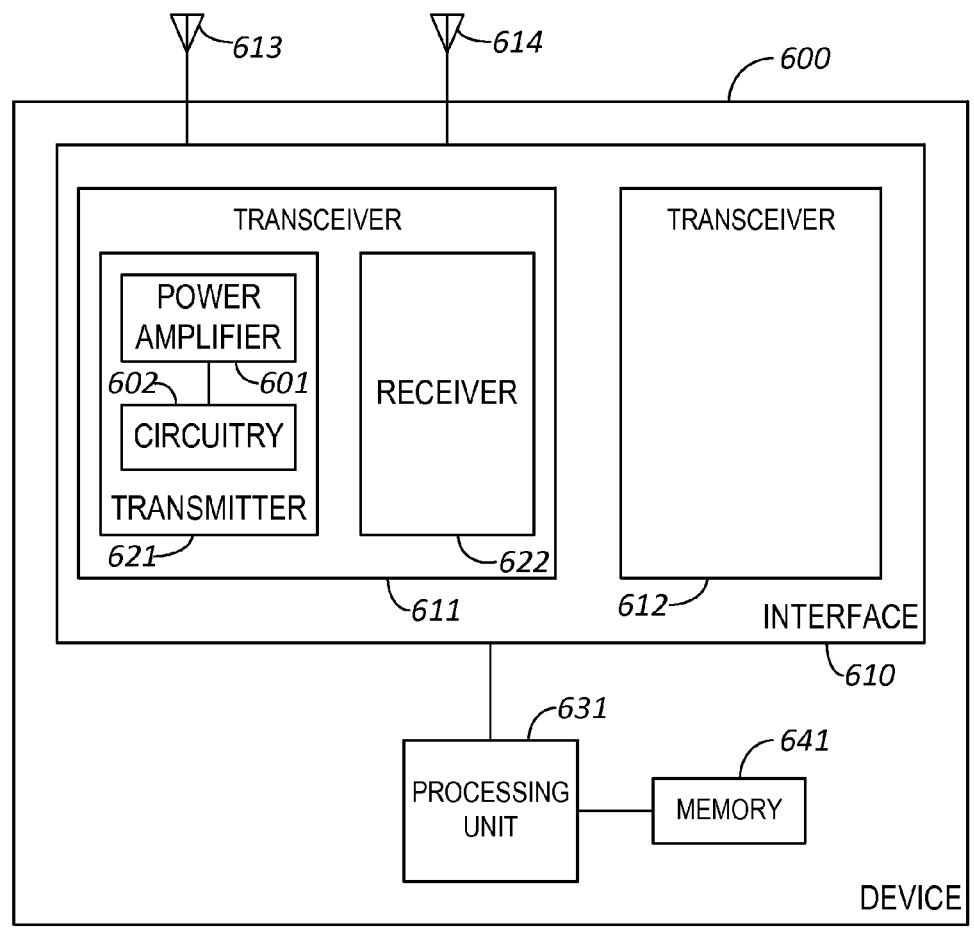
FIG. 6 is a block diagram of UE, which may include an embodiment of the power supply load variation noise reduction for envelope tracking, according to an embodiment.

FIG. 5 is a flowchart of a method, according to some embodiments. At 510, the system configures a number of instantiations of switching load cells based on a number of bits of a digital control signal for each switching event. At 520. the system configures each load cell to operate at a first voltage and at a second voltage where the second voltage is greater than the first voltage. At 530, the system couples a charging capacitor of each load cell to a load capacitance at an output of each load cell. At 540, the system couples a Voltage regulator configured to regulate at the second voltage to the output of each load cell. FIG. 6 is a block diagram of UE, which may include an embodiment of the power supply load variation noise reduction for envelope tracking, according to an embodiment. UE 600 includes an interface 601, according to some embodiments described herein. UE 600 may include power amplifier 601, which includes at least one switching and noise reduction embodiment for envelope tracking as described above. As shown in FIG. 6, user equipment may also include antennas 613 and 614, a processing unit 631, and a memory 641. For simplicity, FIG. 6 omits other elements of device 600 in order not to obscure the embodiments described herein. For example, device 600 may include one or more of a keyboard, a display (e.g., an LCD screen including a touch screen), a non-volatile memory port (e.g., a Universal Serial Bus (USB) port), a graphics processor, an application processor, speakers, and other elements.

User equipment 600 may include a portable wireless communication device, such as a personal digital assistant (PDA), a laptop or portable computer with wireless communication capability, a web tablet, a wireless telephone, a wireless headset, a pager, an instant messaging device, a digital camera, an access point, a television, a medical device (e.g., a heart rate monitor, a blood pressure monitor, etc.), or other device that may receive and/or transmit information wirelessly.

Processing unit 631 and interface 610 of user equipment 500 may be configured to communicate with a single type of communication network or multiple types of communication networks. For example, processing unit 631 and interface 610 may be configured to communicate with one or more of WiFi, WiMax, LTE, and other communication networks.

Processing unit 631 may include a single processor or multiple processors. The processor or processors may include one or more general purpose processors, one or more application-specific integrated circuits (ASICs), or other types of processors. Processing unit 631 may configure messages for transmission by interface 610 to other devices. Processing unit 631 may be configured to communicate with the interface 610 to wirelessly exchange messages with other devices.

Memory 641 may include volatile memory, non-volatile memory, or a combination of both. Memory 641 may contain instructions (e.g., firmware programs, software programs, or a combination of both), which when executed by processing unit 631 result in UE performing operations. Such operations may include wirelessly transmitting, receiving, or both, signals to or from user equipment through antennas 613 and 614.

As shown in FIG. 6, interface 610 may include transceivers 611 and 612, each of which may be configured to communicate with a different network. For example, transceiver 611 may be configured to communicate with an LTE network, and transceiver 612 may be configured to communicate with a WiMax network. FIG. 6 shows an example where UE includes two transceivers (e.g., 611 and 612) and two antennas (e.g., 613 and 614). However, the number of transceivers and antennas may vary.

Transceiver 611 may include a transmitter 621 and a receiver 622 to wirelessly exchange (e.g., send and receive) messages with other devices (not shown in FIG. 6) through at least one of antennas 613 and 614 in at least one of the networks described above. Transceiver 612 may also include a transmitter and a receiver (not shown in FIG. 6) to wirelessly exchange messages with other devices through at least one of antennas 613 and 614.

At least one of transceivers 611 and 612 may include a power amplifier. For example, transmitter 621 of transceiver 612 may include power amplifier 601. As stated above, power amplifier 601 may include one or more embodiments described above.

As shown in FIG. 6, transmitter 621 may include circuitry 602 to generate signals for transmission. Power amplifier 601 may receive signals (e.g., input signals) generated by circuitry 602 and provide signals (e.g., output signals) to at least one of antennas 613 and 614 for transmission. The signals (e.g., input signals) received by power amplifier 601 may include signals similar to or identical to signals described herein with respect to embodiments for switching and for envelope tracking for power amplifiers such as 601 as described above.

Transmitter 621 of transceiver 611 in FIG. 6 may include an OFDM transmitter, such that at least one of the signals generated by circuitry 602 may include an OFDM signal. In some embodiments, transmitter 621 may also include an OFDMA transmitter, such that at least one of the signals generated by circuitry 602 may include an OFDMA signal. UE 600 may be configured to operate in a multiple-input multiple-output (MIMO) configuration. Thus, power amplifier 601 may be coupled to multiple antennas of user equipment 600 (e.g., at least antennas 613 and 614) for MIMO transmissions. The signals generated by circuitry 602 may include preceded OFDM signals, and also OFDMA signals for MIMO transmissions.

Further, transmitter 621 may also include a MIMO transmitter arranged to transmit OFDM signals or OFDMA signals over an uplink channel using a plurality of antenna ports (e.g., antenna ports associated with antennas 613 and 614). The MIMO transmitter may include at least one RF power amplifier (e.g., power amplifier 601) associated with each of the antenna ports.

In FIG. 6, antennas 613 and 614 may include one or more directional or omnidirectional antennas, including, for example, dipole antennas, monopole antennas, patch antennas, loop antennas, microstrip antennas or other types of antennas suitable for transmission of RF signals. In some embodiments, instead of two or more antennas, a single antenna with multiple apertures may be used. In such embodiments, each aperture may be considered a separate antenna.

In some MIMO embodiments, the device antennas may be effectively separated to take advantage of spatial diversity and the different channel characteristics that may result between each of antennas of the device and the antennas of a transmitting station. In some MIMO embodiments, the antennas may be separated by up to $1/10$ of a wavelength or more.

Although UE is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, ASICs, radio-frequency integrated circuits (RFICs), and combinations of various hardware and logic circuitry for performing at least the functions described herein. In some embodiments, the functional elements may refer to one or more processes operating on one or more processing elements.

Figure 7:
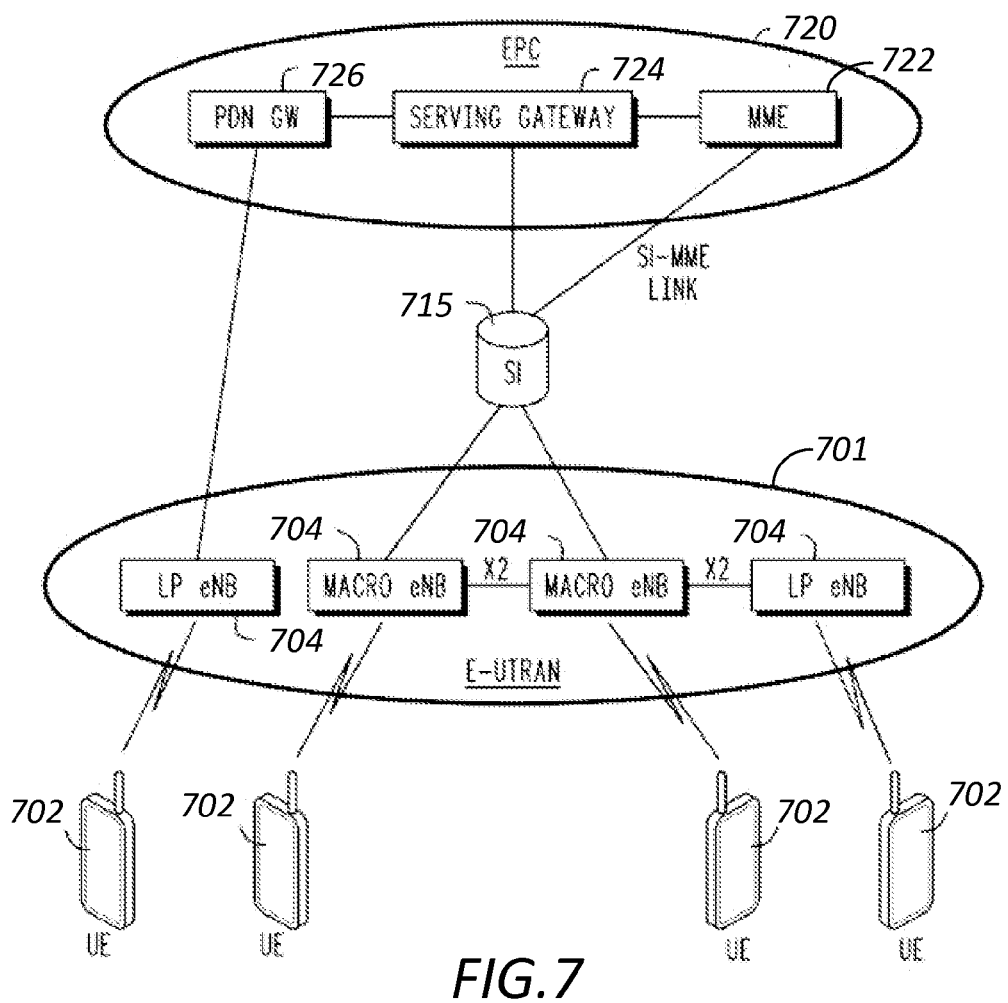
FIG. 7 is a functional diagram of a portion of an end-to-end network architecture of an LTE network in accordance with some embodiments.

FIG. 7 shows a portion of an end-to-end network architecture of an LTE network with various components of the network in accordance with some embodiments. The network 701 comprises a radio access network (RAN) (e.g., as depicted, the E-UTRAN or evolved universal terrestrial radio access network) 701 and the core network 720 (e.g., shown as an evolved packet core (EPC)) coupled together through an S1 interface 715. For convenience and brevity sake, only a portion of the core network 720, as well as the RAN 701, is shown.

The core network 720 includes mobility management entity (MME) 722, serving gateway (serving GW) 724, and packet data network gateway (PDN GW) 726. The RAN includes enhanced node B's (eNBs) 704 (which may operate as base stations) for communicating with user equipment (UE) 702. The eNBs 704 may include macro eNBs and low power (LP) eNBs.

The MME is similar in function to the control plane of legacy Serving GPRS Support Nodes (SGSN). The MME manages mobility aspects in access such as gateway selection and tracking area list management. The serving GW 724 terminates the interface toward the RAN 701, and routes data packets between the RAN 701 and the core network 720. In addition, it may be a local mobility anchor point for inter-eNB handovers and also may provide an anchor for inter-3GPP mobility. Other responsibilities may include lawful intercept, charging, and some policy enforcement. The serving GW 724 and the MME 722 may be implemented in one physical node or separate physical nodes. The PDN GW 726 terminates an SGi interface toward the packet data network (PDN). The PDN GW 726 routes data packets between the EPC 720 and the external PDN, and may be a key node for policy enforcement and charging data collection. It may also provide an anchor point for mobility with non-LTE accesses. The external PDN can be any kind of IP network, as well as an IP Multimedia Subsystem (IMS) domain. The PDN GW 726 and the serving GW 724 may be implemented in one physical node or separated physical nodes.

The eNBs 704 (macro and micro) terminate the air interface protocol and may be the first point of contact for a UE 702. In some embodiments, an eNB 704 may fulfill various logical functions for the RAN 701 including but not limited to RNC (radio network controller functions) such as radio bearer management, uplink and downlink dynamic radio resource management and data packet scheduling, and mobility management. In accordance with embodiments, UEs 702 may be configured to communicate OFDM communication signals with an eNB 704 over a multicarrier communication channel in accordance with an OFDMA communication technique. The OFDM signals may comprise a plurality of orthogonal subcarriers.

The S1 interface 715 is the interface that separates the RAN 701 and the EPC 720. It is split into two parts: the S1-U, which carries traffic data between the eNBs 704 and the serving GW 724, and the S1-MME, which is a signaling interface between the eNBs 704 and the MME 722. The X2 interface is the interface between eNBs 704. The X2 interface comprises two parts, the X2-C and X2-U. The X2-C is the control plane interface between the eNBs 704, while the X2-U is the user plane interface between the eNBs 704.

With cellular networks, LP cells are typically used to extend coverage to indoor areas where outdoor signals do not reach well, or to add network capacity in areas with very dense phone usage, such as train stations. As used herein, the term low power (LP) eNB refers to any suitable relatively low power eNB for implementing a narrower cell (narrower than a macro cell) such as a femtocell, a picocell, or a micro cell. Femtocell eNBs are typically provided by a mobile network operator to its residential or enterprise customers. A femtocell is typically the size of a residential gateway or smaller, and generally connects to the user's broadband line. Once plugged in, the femtocell connects to the mobile operator's mobile network and provides extra coverage in a range of typically 30 to 50 meters for residential femtocells. Thus, a LP eNB might be a femtocell eNB since it is coupled through the PDN GW 726. Similarly, a picocell is a wireless communication system typically covering a small area, such as in-building (offices, shopping malls, train stations, etc.), or more recently in-aircraft. A picocell eNB can generally connect through the X2 link to another eNB such as a macro eNB through its base station controller (BSC) functionality. Thus, LP eNB may be implemented with a picocell eNB since it is coupled to a macro eNB via an X2 interface. Picocell eNBs or other LP eNBs may incorporate some or all functionality of a macro eNB. In some cases, this may be referred to as an access point base station or enterprise femtocell.

In some embodiments, a downlink resource grid may be used for downlink transmissions from an eNB to a UE. The grid may be a time-frequency grid, called a resource grid, which is the physical resource in the downlink in each slot. Such a time-frequency plane representation is a common practice for OFDM systems, which makes it intuitive for radio resource allocation. Each column and each row of the resource grid correspond to one OFDM symbol and one OFDM subcarrier, respectively. The duration of the resource grid in the time domain corresponds to one slot in a radio frame. The smallest time-frequency unit in a resource grid is denoted as a resource element. Each resource grid comprises a number of resource blocks, which describe the mapping of certain physical channels to resource elements. Each resource block comprises a collection of resource elements and in the frequency domain, this represents the smallest quanta of resources that currently can be allocated. There are several different physical downlink channels that are conveyed using such resource blocks. With particular relevance to this disclosure, two of these physical downlink channels are the physical downlink shared channel and the physical down link control channel.

The physical downlink shared channel (PDSCH) carries user data and higher-layer signaling to a UE 702 (FIG. 7). The physical downlink control channel (PDCCH) carries information about the transport format and resource allocations related to the PDSCH channel, among other things. It also informs the UE about the transport format, resource allocation, and H-ARQ information related to the uplink shared channel. Typically, downlink scheduling (assigning control and shared channel resource blocks to UEs within a cell) is performed at the eNB based on channel quality information fed back from the UEs to the eNB, and then the downlink resource assignment information is sent to a UE on the control channel (PDCCH) used for (assigned to) the UE.

The PDCCH uses CCEs (control channel elements) to convey the control information. Before being mapped to resource elements, the PDCCH complex-valued symbols are first organized into quadruplets, which are then permuted using a sub-block inter-leaver for rate matching. Each PDCCH is transmitted using one or more of these control channel elements (CCEs), where each CCE corresponds to nine sets of four physical resource elements known as resource element groups (REGs). Four QPSK symbols are mapped to each REG. The PDCCH can be transmitted using one or more CCEs, depending on the size of DCI and the channel condition. There may be four or more different PDCCH formats defined in LTE with different numbers of CCEs (e.g., aggregation level, L,=1, 2, 4, or 8).

EXAMPLES AND ADDITIONAL NOTES

In Example 1, switching apparatus for switching a digital structure can comprise a plurality of instantiations of switching load cells configured to operate at a first voltage and at a second voltage to switch digital signals, the second voltage lower than the first voltage, each of the plurality of instantiations configured to be turned on by a respective bit of a digital control signal, each load cell comprising: a charging capacitor configured to be coupled to a power amplifier, an output configured to be coupled to a load capacitance, switching circuitry configured to couple the charging capacitor to the load capacitance and connect a voltage regulator to the output to regulate voltage at the output to the second voltage, and a control signal source configured to provide the digital control signal.

In Example 2, the switching apparatus of Example 1 can optionally configure a number of the plurality of instantiations based on the number of bits of the digital control signal and the switching circuitry can be further configured to: couple the charging capacitor to the first voltage, couple the charging capacitor to the load capacitance and disconnect the first voltage from the charging capacitor during a switching event, disconnect the charging capacitor from the load capacitance, and connect the voltage regulator to the output after the switching event to provide a desired spectral noise signal.

In Example 3, in the switching circuitry of any one or more of Examples 1-2, can optionally comprise a P-type Metal Oxide Semiconductor PMOS gate.

In Example 4, the switching circuitry of any one or more of Examples 1-3 can optionally comprise a plurality of switching circuits.

In Example 5 the second voltage of any one or more of Examples 1-4 optionally can be created by a capacitive charge between the load capacitance and the charging capacitor.

In Example 6, the switching apparatus of any one or more of Examples 1-5 the ratio of the charging capacitor to the load capacitance can optionally be based on a ratio of the second voltage divided by the difference between the first voltage and the second voltage.

In Example 7, the voltage regulator of any one or more of Examples 1-6 optionally comprises a low dropout regulator.

In Example 8, each load cell of any one or more of Examples 1-7 optionally may have its own charging capacitor.

In Example 9, the ratio of the charging capacitor to the load capacitance of any one or more of Examples 1-8 can optionally be approximately 1.25.

In Example 10, an envelope tracking apparatus can comprise a power amplifier (PA) configured to be coupled to a source of digital signals; a plurality of instantiations of switching load cells configured to be switched to operate at a first voltage and at a second voltage for switching the digital signals, the second voltage lower than the first voltage, each of the plurality of instantiations configured to be turned on by a bit of a digital control signal, each load cell comprising: a charging capacitor configured to be coupled to a PA, an output configured to be coupled to a load capacitance, and switching circuitry configured to couple the charging capacitor to the load capacitance and connect a voltage regulator to the output to regulate voltage at the output to the second voltage; a switch control coupled to the PA and configured to switch the PA between the first voltage and the second voltage during a switching event for envelope tracking; and a bypass capacitor coupled to the plurality of instantiations of the switching load cells, the capacitance of the capacitor being at least about a sum of the charging capacitors of the plurality of instantiations of the switching load cells that are turned on.

In Example 11, the number of the plurality of instantiations of Example 10 optionally is based on the number of bits of the digital control signal and the switching circuitry is further configured to: couple the charging capacitor to the first voltage, couple the charging capacitor to the load capacitance and disconnect the first voltage from the charging capacitor during the switching event, disconnect the charging capacitor from the load capacitance, and connect the voltage regulator to the output after the switching event to provide a desired spectral noise signal.

In Example 12, in the switching circuitry of any one or more of Examples 10-11 can optionally comprise a PMOS gate.

In Example 13, the switching circuitry of any one or more of Examples 10-12 can optionally comprise a plurality of switching circuits.

In Example 14, the second voltage of any one or more of Examples 10-13 can optionally be created by the capacitive charge between the load capacitance and the charging capacitor.

In Example 15, the ratio of the charging capacitor to the load capacitance of each instantiation of switching cell of any one or more of Examples 10-14 can optionally be, or be based on, the ratio of the value of the second voltage divided by the difference between the value of the first voltage and the value of the second voltage.

In Example 16, the regulator of any one or more of Examples 10-15 can optionally be a low dropout regulator.

In Example 17, the each load cell of the plurality instantiations of load cells of any one or more of Examples 10-16 can optionally have its own, or a respective, charging capacitor value.

In Example 18, a transmitter can comprise a circuitry to generate at least one multiplexed signal for transmission, and an envelope tracking apparatus coupled to the circuitry and comprising: a power amplifier (PA) configured to be coupled to a source of digital signals to be switched, a plurality of instantiations of switching load cells configured to operate at a first voltage and at a second voltage for switching the digital signals, the second voltage lower than the first voltage, each of the plurality of instantiations configured to be turned on by a bit of a digital control signal during a switching event of at least some of the digital signals, each load cell comprising: a charging capacitor configured to be coupled to the PA, an output configured to be coupled to a load capacitance, and switching circuitry configured to couple the charging capacitor to the load capacitance and connect a voltage regulator to the output to regulate voltage at the output to the second voltage; a switch control coupled to the PA and configured to switch the PA between the first voltage and the second voltage during each switching event for envelope tracking; and a bypass capacitor coupled to the plurality of instantiations of the switching load cells, the capacitance of the capacitor being at least approximately the sum of the charging capacitors of the plurality of instantiations of the switching load cells that are turned on.

In Example 19, the number of the plurality of instantiations can be based on the number of bits of the digital control signal and the switching circuitry of Example 18 can optionally be further configured to: couple the charging capacitor to the first voltage, couple the charging capacitor to the load capacitance and disconnect the first voltage from the charging capacitor during the switching event, and disconnect the charging capacitor from the load capacitance, and connect the voltage regulator operating at the second voltage to the output after the switching event to provide a desired spectral noise signal.

In Example 20, the second voltage of any one or more of Examples 18-19 is optionally created by the capacitive charge between the load capacitance and the charging capacitor.

In Example 21, the ratio of the charging capacitor to the load capacitance of any one or more of Examples 18-20 is optionally based on the ratio of the value of the second voltage divided by the difference between the value of the first voltage and the value of the second voltage.

In Example 22, the regulator of any one or more of Examples 18-21 can optionally be a low dropout regulator.

In Example 23, the each load cell of the plurality instantiations of load cells of any one or more of Examples 18-22 can optionally have a respective charging capacitor value.

In Example 24, the transmitter of any one or more of Examples 18-23 can optionally further comprise one or more antennas configured for transmission of the at least one radio frequency signal.

In Example 25, a method of for noise reduction in envelope tracking for switching events comprises configuring a number of instantiations of switching load cells based on a number of bits of a digital control signal for each switching event; configuring each load cell to operate at a first voltage and at a second voltage; coupling a charging capacitor of each load cell to a load capacitance at an output of each load cell; and coupling a voltage regulator configured to regulate at the second voltage to the output of each load cell.

In Example 26, the charging capacitor of each switching load cell of Example 25 can optionally be scaled to the load capacitance at the output of the switching load cell, the second voltage being greater than the first voltage, and the second voltage being created by a capacitive charge between the load capacitance and the charging capacitor.

In Example 27, the ratio of the charging capacitor to the load capacitance of any one or more of Examples 25-26, can optionally be based on a ratio of the second voltage divided by the difference between the first voltage and the second voltage.

In Example 28, a ratio of the charging capacitor to the load capacitance of any one or more of Examples 25-27 can optionally be approximately 1.25.

In Example 29 the scaled charging capacitor of one or more of examples 25-28 can optionally store a compensating charge provided by the scaling of the charging capacitor to the load capacitance.

In Example 30, the first voltage of one or more of examples 25-29 can optionally be greater than the second voltage, the second voltage being created by a capacitive charge between the load capacitance and the charging capacitor.

Example 31 can include, or can optionally be combined with any portion or combination of any portions of any one or more of Examples 1 through 30 to include, subject matter that can include means for performing any one or more of the functions of Examples 1 through 28, or a machine-readable medium including instructions that, when performed by a machine, cause the machine to perform any one or more of the functions of Examples 1 through 30.

Embodiments described herein may be implemented in one or a combination of hardware, firmware, and software. Embodiments described herein may also be implemented as instructions stored on a computer-readable storage medium, which may be read and executed by at least one processor to perform the operations described herein. A computer-readable storage medium may include any non-transitory or other mechanism for storing information in a form readable by a machine (e.g., a computer). For example, a computer-readable storage medium may include read-only memory (ROM), random-access memory (RAM), magnetic disk storage media, optical storage media, flash-memory devices, and other storage devices and media. In these embodiments, one or more processors of user equipment may be configured with the instructions to perform the operations described herein.

The above description and the drawings illustrate some embodiments to enable those skilled in the art to practice the embodiments disclosed. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description. Therefore, the scope of various embodiments disclosed is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

The invention claimed is:

1. A switching apparatus for switching a digital structure, the switching apparatus comprising:
   a plurality of instantiations of switching load cells configured to operate at a first voltage and at a second voltage to switch digital signals, each of the plurality of switching load cells configured to be turned on by a respective bit of a digital data signal that controls the digital structure, each switching load cell comprising:
      a charging capacitor configured to be coupled to a power amplifier;
      an output node configured to be coupled to a load capacitance;
      a switching circuitry configured to couple the charging capacitor to the load capacitance and connect a voltage regulator to the output node to regulate voltage at the output node to the second voltage during a switching event, wherein during the switching event the charging capacitor is detached from the first voltage, and the ratio between the charging capacitor and the load capacitance creates a desired value of the second voltage; and
      a signal source configured to provide the digital data signal.

2. The switching apparatus of claim 1 wherein the switching apparatus configures a number of the plurality of instantiations of switching load cells based on a number of bits of the digital data signal, the second voltage is lower than the first voltage, and the switching circuitry is further configured to:
   couple the charging capacitor to the first voltage,
   couple the charging capacitor to the load capacitance and disconnect the first voltage from the charging capacitor during the switching event,
   disconnect the charging capacitor from the load capacitance, and
   connect the voltage regulator to the output after the switching event to provide a desired spectral noise signal.

3. The switching apparatus of claim 2 wherein the switching circuitry comprises a P-type Metal Oxide Semiconductor (PMOS) gate.

4. The switching apparatus of claim 2 wherein the switching circuitry comprises a plurality of switching circuits.

5. The switching apparatus of claim 2 wherein the second voltage is created by a capacitive charge between the load capacitance and the charging capacitor.

6. The switching apparatus of claim 1 wherein the ratio of the charging capacitor to the load capacitance is based on a ratio of the second voltage divided by the difference between the first voltage and the second voltage.

7. The switching apparatus of claim 2 wherein the voltage regulator is a low dropout regulator that absorbs charge error created by mismatch and non linearities.

8. The switching apparatus of claim 2 wherein each switching load cell has a respective charging capacitor value.

9. The switching apparatus of claim 2 wherein a ratio of the charging capacitor to the load capacitance is approximately 1.25.

10. An envelope tracking apparatus comprising:
    a power amplifier (PA) configured to be coupled to a source of digital signals;
    a plurality of instantiations of switching load cells configured to be switched to operate at a first voltage and at a second voltage for switching the digital signals, each of the plurality of switching load cells configured to be turned on by a bit of a digital control signal, each switching load cell comprising:
       a charging capacitor configured to be coupled to the PA,
       an output node configured to be coupled to a load capacitance, and
       switching circuitry configured to couple the charging capacitor to the load capacitance and connect a voltage regulator to the output node to regulate voltage at the output node to the second voltage;
    a switch control coupled to the PA and configured to switch the PA between the first voltage and the second voltage during a switching event to track an envelope; and
    a bypass capacitor coupled to the plurality of the switching load cells, the capacitance of the capacitor being at least about a sum of the charging capacitors of the plurality of the switching load cells that are turned on.

11. The envelope tracking apparatus of claim 10 wherein the number of the plurality of instantiations of switching load cells is based on a number of bits of the digital control signal, the second voltage is lower than the first voltage, and the switching circuitry is further configured to:
    couple the charging capacitor to the first voltage, couple the charging capacitor to the load capacitance and disconnect the first voltage from the charging capacitor during the switching event, disconnect the charging capacitor from the load capacitance, and connect the voltage regulator to the output node after the switching event to provide a desired spectral noise signal.

12. The envelope tracking apparatus of claim 11 wherein the switching circuitry comprises a P-type Metal Oxide Semiconductor (PMOS) gate.

13. The envelope tracking apparatus of claim 11 wherein the switching circuitry comprises a plurality of switching circuits.

14. The envelope tracking apparatus of claim 11 wherein the second voltage is created by the capacitive charge between the load capacitance and the charging capacitor.

15. The envelope tracking apparatus of claim 11 wherein the ratio of the charging capacitor to the load capacitance of each switching load cell is based on the ratio of the value of the second voltage divided by the difference between the value of the first voltage and the value of the second voltage.

16. The envelope tracking apparatus of claim 11 wherein the regulator is a low dropout regulator that absorbs charge error created by mismatch and non linearities.

17. The envelope tracking apparatus of claim 11 wherein each switching load cell of the plurality switching load cells has a respective charging capacitor value.

18. A transmitter comprising:
a circuitry to generate at least one multiplexed signal for transmission; and
an envelope tracking apparatus coupled to the circuitry and comprising:
a power amplifier (PA) configured to be coupled to a source of digital signals to be switched;
a plurality of instantiations of switching load cells configured to operate at a first voltage and at a second voltage for switching the digital signals, each of the plurality of switching load cells configured to be turned on by a bit of a digital control signal during a switching event of at least some of the digital signals, each switching load cell comprising:
a charging capacitor configured to be coupled to the PA;
an output node configured to be coupled to a load capacitance; and
switching circuitry configured to couple the charging capacitor to the load capacitance and connect a voltage regulator to the output node to regulate voltage at the output node to the second voltage;
a switch control coupled to the PA and configured to switch the PA between the first voltage and the second voltage during each switching event to track an envelope; and
a bypass capacitor coupled to the plurality of the switching load cells, the capacitance of the capacitor being at least about a sum of the charging capacitors of the plurality of the switching load cells that are turned on.

19. The transmitter of claim 18 wherein the number of the plurality of instantiations of switching load cells is based on a number of bits of the digital control signal, the second voltage is lower than the first voltage, and the switching circuitry is further configured to:
couple the charging capacitor to the first voltage,
couple the charging capacitor to the load capacitance and disconnect the first voltage from the charging capacitor during the switching event, and
disconnect the charging capacitor from the load capacitance, and connect the voltage regulator operating at the second voltage to the output node after the switching event to provide a desired spectral noise signal.

20. The transmitter of claim 19 wherein the second voltage is created by the capacitive charge between the load capacitance and the charging capacitor.

21. The transmitter of claim 19 wherein the ratio of the charging capacitor to the load capacitance is based on the ratio of the value of the second voltage divided by the difference between the value of the first voltage and the value of the second voltage.

22. The transmitter of claim 19 wherein the regulator is a low dropout regulator that absorbs charge error created by mismatch and non linearities.

23. The transmitter of claim 19 wherein each switching load cell of the plurality load cells has a respective charging capacitor value.

24. The transmitter of claim 19 further comprising one or more antennas configured for transmission of the at least one radio frequency signal.

25. A method for noise reduction in envelope tracking for switching events, the method comprising:
configuring a number of switching load cells based on a number of bits of a digital data signal for each switching event;
configuring each switching load cell to operate at a first voltage and at a second voltage;
coupling a charging capacitor of each switching load cell to a load capacitance at an output node of each switching load cell; and
coupling a voltage regulator configured to regulate at the second voltage to the output node of each switching load cell, during a switching event, wherein during the switching event the charging capacitor is detached from the first voltage, and the ratio between the charging capacitor and the load capacitance creates a desired value of the second voltage.

26. The method of claim 25 wherein charging capacitor of each switching load cell is scaled to the load capacitance at the output node of the switching load cell and the second voltage is greater than the first voltage, second voltage being created by a capacitive charge between the load capacitance and the charging capacitor.

27. The method of claim 26 wherein the ratio of the charging capacitor to the load capacitance is based on a ratio of the second voltage divided by the difference between the first voltage and the second voltage.

28. The method of claim 26 wherein a ratio of the charging capacitor to the load capacitance is approximately 1.25.

29. The method of claim 26 wherein scaled charging capacitor stores a compensating charge provided by the scaling of the charging capacitor to the load capacitance.

30. The method of claim 25 wherein charging capacitor of each switching load cell is scaled to the load capacitance at the output node of the switching load cell and the first voltage is greater than the second voltage, the second voltage being created by a capacitive charge between the load capacitance and the charging capacitor.

* * * * *